United States Patent
Labunsky et al.

[19]

[11] Patent Number: 6,132,289
[45] Date of Patent: *Oct. 17, 2000

[54] APPARATUS AND METHOD FOR FILM THICKNESS MEASUREMENT INTEGRATED INTO A WAFER LOAD/UNLOAD UNIT

[75] Inventors: Michael Labunsky, San Carlos; Andrew Nagengast, Sunnyvale; Anil Pant, Santa Clara, all of Calif.

[73] Assignee: Lam Research Corporation, Fremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 09/052,148

[22] Filed: Mar. 31, 1998

[51] Int. Cl.⁷ ..................................................... B24B 37/00
[52] U.S. Cl. .................................. 451/6; 451/66; 451/288
[58] Field of Search .................................. 451/6, 66, 65, 451/288, 4

[56] References Cited

U.S. PATENT DOCUMENTS

| | | |
|---|---|---|
| 3,903,656 | 9/1975 | Binder .................................... 51/108 R |
| 4,433,510 | 2/1984 | Katagiri et al. ......................... 51/165 R |
| 4,793,895 | 12/1988 | Kaanta et al. . |
| 5,036,015 | 7/1991 | Sandhu et al. . |
| 5,081,421 | 1/1992 | Miller et al. . |
| 5,213,655 | 5/1993 | Leach et al. . |
| 5,240,552 | 8/1993 | Yu et al. . |
| 5,308,438 | 5/1994 | Cote et al. . |
| 5,321,304 | 6/1994 | Rostoker . |
| 5,329,732 | 7/1994 | Karlsrud et al. . |
| 5,433,651 | 7/1995 | Lustig et al. . |
| 5,469,689 | 11/1995 | Demarest et al. ......................... 53/430 |
| 5,558,568 | 9/1996 | Talieh et al. . |
| 5,679,055 | 10/1997 | Greene et al. ............................. 451/10 |
| 5,679,060 | 10/1997 | Leonard et al. ......................... 451/143 |
| 5,692,947 | 12/1997 | Talieh et al. . |
| 5,700,180 | 12/1997 | Sandhu et al. .............................. 451/5 |
| 5,791,970 | 8/1998 | Yueh .......................................... 451/8 |
| 5,872,633 | 2/1999 | Holzapfel et al. ...................... 356/381 |

FOREIGN PATENT DOCUMENTS

| | | |
|---|---|---|
| 0 648 575 A1 | 9/1994 | European Pat. Off. . |
| 0706 851 A1 | 11/1995 | European Pat. Off. . |
| 2 296 458 | 7/1996 | United Kingdom . |
| WO 96/02355 | 2/1996 | WIPO . |

OTHER PUBLICATIONS

Search Report for PCT/US99/06241 dated Jul. 16, 1999.

*Primary Examiner*—Mark Rosenbaum
*Assistant Examiner*—William Hong
*Attorney, Agent, or Firm*—Brinks Hofer Gilson & Lione

[57] ABSTRACT

A technique for integrating a film thickness monitoring sensor within a load and unload unit of a cluster tool for performing chemical-mechanical polishing (CMP). In order to determine CMP performance, a sensor (or sensors) for determining film thickness is/are integrated within the load and unload unit of the cluster tool. Accordingly, film thickness measurements can then be taken at discrete times during the processing cycle without removing the wafer from the cluster tool.

18 Claims, 2 Drawing Sheets

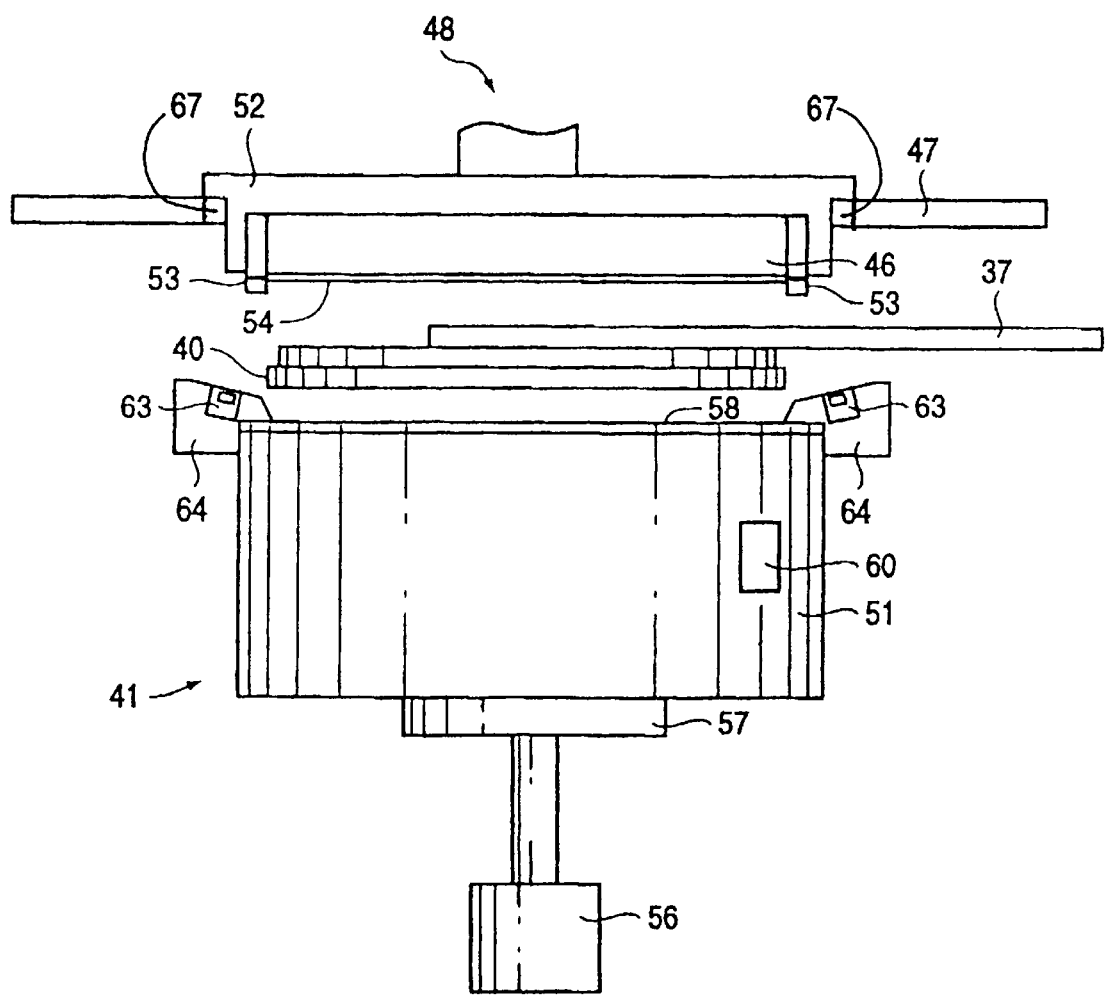

APPARATUS AND METHOD FOR FILM THICKNESS MEASUREMENT INTEGRATED INTO A WAFER LOAD/UNLOAD UNIT

BACKGROUND OF THE INVENTION

1. Field of the Invention

The present invention relates to the field of semiconductor wafer processing and, more particularly, to equipment utilized to planarize semiconductor wafers.

2. Background of the Related Art

The manufacture of an integrated circuit device requires the formation of various layers above a base substrate to form the necessary components and interconnects. During the manufacturing process, removal of a certain layer or portions of a layer must be achieved in order to pattern and form various components and interconnects. In modern integrated circuit (IC) fabrication technology, it is necessary to form various structures over previous layers formed on a semiconductor wafer. With diminishing feature size such structures result in highly irregular surface topography causing manufacturing problems in the formation of thin film layers. To facilitate manufacturing processes, the rough surface topography has to be smoothened or planarized.

One of the methods for achieving planarization of the wafer surface is chemical mechanical polishing (CMP). CMP is being extensively pursued to planarize a surface of a semiconductor wafer, such as a silicon wafer, at various stages of integrated circuit processing. CMP is also used in flattening optical surfaces, metrology samples, and various metal and semiconductor based substrates.

CMP is a technique in which a chemical slurry is used along with a polishing pad to polish away materials on a semiconductor wafer. The mechanical movement of the pad relative to the wafer, in combination with the chemical reaction of the slurry disposed between the wafer and the pad, provide the abrasive force with chemical erosion to planarize the exposed surface of the wafer (typically, a layer formed on the wafer), when subjected to a force pressing the wafer onto the pad. In the most common method of performing CMP, a substrate is mounted on a polishing head which rotates against a polishing pad placed on a rotating table (see, for example, U.S. Pat. No. 5,329,732). The mechanical force for polishing is derived from the rotating table speed and the downward force on the head. The chemical slurry is constantly transferred under the polishing head. Rotation of the polishing head helps in the slurry delivery, as well as in averaging the polishing rates across the substrate surface.

Another technique for performing CMP to obtain a more effective polishing rate is performing the CMP using the linear planarization technique. Instead of a rotating pad, a moving belt is used to linearly move the pad across the wafer surface. The wafer is still rotated for averaging out the local variations, but the global planarity is improved over CMP tools using rotating pads. One such example of a linear polisher is described in U.S. Pat. No. 5,692,947.

Unlike the hardened table top of a rotating polisher, linear planarizing tools are capable of using flexible belts, upon which the pad is disposed. This flexibility allows the belt to flex, which can cause a change in the pad pressure being exerted on the wafer. When this flexibility can be controlled, it provides a mechanism for adjusting the planarization rate and/or the profile across the surface of the wafer. Therefore, a fluid support (or platen) can be used to adjust the pad pressure being exerted on a wafer at various locations along the wafer surface. An example of a fluid support is disclosed in U.S. Pat. No. 5,558,568.

When CMP is employed, it is generally advantageous to monitor the effects of the planarizing process to determine if the process is being performed according to desired specifications. Furthermore, when the polishing profile can be adjusted, such as with the use of the linear polisher (planarizing tool) described above, the monitoring of the CMP process allows the planarizing profiles to be adjusted pursuant to the measured values obtained from the monitoring. Accordingly, it would be advantageous to provide some form of monitoring during the actual polishing process or between the polishing of each wafer, so that measurements can be obtained to ascertain various polishing parameters.

A monitoring problem specific to CMP is the determination of the process end point. That is, the ability to monitor the thickness of the material being removed (or alternatively, the thickness of the material remaining). Essentially, the CMP process is monitored and the planarizing process terminated, when some desired preset material thickness parameter is achieved on the wafer surface. The end-point detection technique detects this point where the CMP process is to be stopped. There are a variety of end-point detection schemes known in the art.

For example, one technique employs an electrode, which is inserted into the polish platen in order to monitor the capacitance of a dielectric layer disposed on a wafer substrate surface (see for example, U.S. Pat. No. 5,081,421). Another technique employs the monitoring of the electrical current to a motor which rotates the wafer (see for example, U.S. Pat. Nos. 5,308,438 and 5,036,015). Other techniques using electrical current to detect the process end-point are also known. For example, the presence or absence of a metal layer can be detected by current flow (see for example, U.S. Pat. No. 4,793,895) or by using an impedance measurement (see for example, U.S. Pat. No. 5,213,655). Another technique is the use of resistance or impedance measurements by using contact structures through the wafer (see for example, U.S. Pat. No. 5,321,304). Still another technique uses an acoustic wave reflection to monitor dielectric thickness (see for example, U.S. Pat. No. 5,240,552). Optical techniques are now being implemented as an accurate indicator for measuring material thickness on a wafer (see for example, U.S. Pat. No. 5,433,651). Accordingly, it is understood that a number of techniques are available for detecting the end-point of a polishing cycle for a semiconductor wafer.

Historically, there have been two general approaches to monitoring the thickness of a material film layer residing on a wafer. The first approach is the "stand alone" scheme. In a stand alone system, the film thickness measurements are obtained after a wafer has been fully processed. The thickness measurements are obtained on a separate piece of monitoring equipment, usually disposed as a "stand-alone" equipment and not part of the CMP tool. This technique only provides a post-mortem information of the remaining film quality, which frequently results in considerable loss of manufacturing time to correct the process if the material thickness removal is out of tolerance.

The second approach is the "in-situ" detection scheme in which in-situ end-point detectors monitor the ongoing polishing process. Such in-situ detectors are usually integrated into the CMP tool itself. Although in-situ systems allow for adjustments to be made during the on-going process, the equipment usually requires extremely sophisticated algorithms to interpret and to predict the correct film thickness.

Furthermore, when multi-level integrated circuit devices are being planarized, the algorithm can become significantly complex. In some instances, such complex algorithms can take considerably long time to execute, which can add appreciable time to the polishing process.

The present invention implements a CMP monitoring tool which draws on a stand alone concept, but is integrated into a cluster tool configuration to provide for monitoring of the CMP process during the processing cycle of a wafer. Instead of using an in-situ monitoring scheme, the present invention provides for discrete steps in monitoring the wafer during the CMP process.

SUMMARY OF THE INVENTION

The present invention describes a technique for integrating a film thickness monitoring sensor within a load and unload unit of a cluster tool for performing chemical-mechanical polishing (CMP). In the specific embodiment, a plurality of linear polishers (two in the specific example) for planarizing a semiconductor wafer are configured within the cluster tool. Also configured within the cluster tool is a load and unload unit, which accepts the wafer for processing by the processing elements of the tool and unloads the wafer when the polishing is done. A rotary buff module is also configured within the cluster to buff and clean the polished wafer. The four modules are clustered to form a cluster tool or system.

In order to determine CMP performance, a sensor (or sensors) for determining film thickness is/are integrated within the load and unload unit of the cluster tool. Film thickness measurements can then be taken at discrete times during the processing cycle without removing the wafer from the cluster tool. Furthermore, in the preferred embodiment, an additional rinsing function is provided by the load and unload module of the preferred embodiment.

BRIEF DESCRIPTION OF THE DRAWINGS

FIG. 3 is a cross-sectional view of the load/unload/cleaner module of the preferred embodiment, in which a film thickness measurement device is integrated therein.

DETAILED DESCRIPTION OF THE PREFERRED EMBODIMENTS

A scheme for integrating a wafer monitoring tool with a load/unload unit of a cluster tool to provide CMP for planarizing a wafer surface is described. In the following description, numerous specific details are set forth, such as specific structures, equipment, sensors, polishing techniques, etc., in order to provide a thorough understanding of the present invention. However, it will be appreciated by one skilled in the art that the present invention may be practiced without these specific details. In other instances, well known techniques, structures and processes have not been described in detail in order not to obscure the present invention.

It is to be noted that the present invention is described herein in reference to a cluster tool for a CMP linear planarization tool (also commonly referred to as a linear polisher), however, it is readily understood that the present invention can be practiced with other types of tools as well (including a rotary polisher) without departing from the spirit and scope of the present invention. Furthermore, although the present invention is described in reference to performing CMP on a film layer formed on a semiconductor wafer, the invention can be readily adapted to polish other materials as well, such as glass, metal substrates or other semiconductor substrates, including substrates for use in manufacturing flat panel displays.

Figure 1:
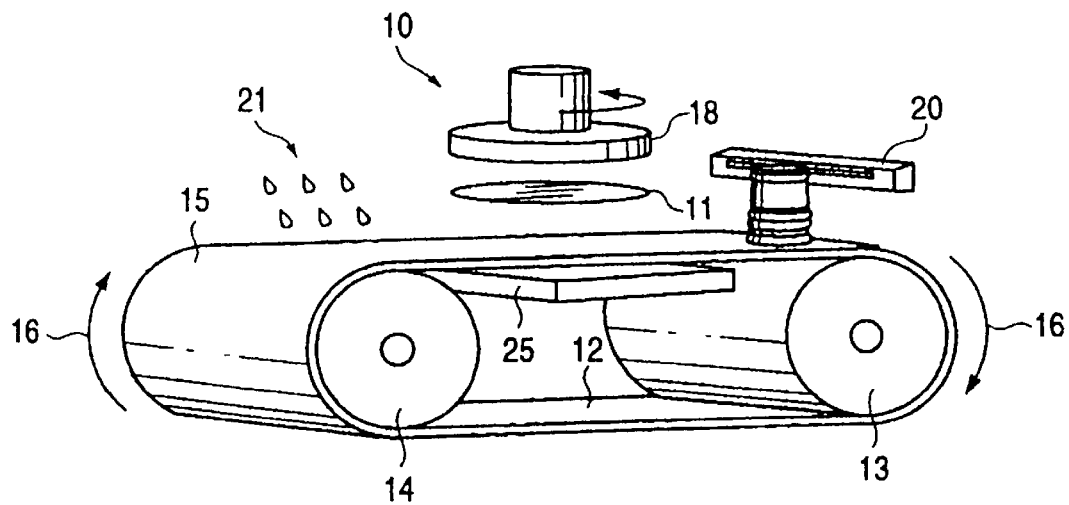
FIG. 1 is a pictorial illustration of a prior art linear polisher.

Referring to FIG. 1, a linear polisher 10 for use in practicing the present invention is shown. The linear polisher (also referred to as a linear planarization tool) 10 is utilized in planarizing a semiconductor wafer 11, such as a silicon wafer, to polish away materials on the surface of the wafer. The material being removed can be the substrate material of the wafer itself or one of the layers (such as a film layer) formed on the substrate. Formed layers include dielectric materials (such as silicon dioxide), metals (such as aluminum, copper or tungsten) and alloys, or semiconductor materials (such as silicon or polysilicon). More specifically, a polishing technique generally known in the art as chemical-mechanical polishing (CMP) is employed to polish one or more of these layers fabricated on the wafer 11, in order to planarize the surface. Generally, the art of performing CMP to polish away layers on a wafer is known and prevalent practice has been to perform CMP by subjecting the surface of the wafer to a rotating platform (or platen) containing a pad (see for example, U.S. Pat. No. 5,329,732).

The linear polisher 10 utilizes a belt 12, which moves linearly with respect to the surface of the wafer 11. The belt 12 is a continuous belt rotating about rollers (or spindles) 13 and 14, in which one roller or both is/are driven by a driving means, such as a motor, so that the rotational motion of the rollers 13–14 causes the belt 12 to be driven in a linear motion (as shown by arrow 16) with respect to the wafer 11. A polishing pad 15 is affixed onto the belt 12 at its outer surface facing the wafer 11. In some instances, the pad 15 and the belt 12 are integrated as a single unit. Either way, the belt/pad assembly is made to move linearly to planarize the wafer 11.

The wafer 11 typically resides within a wafer carrier 18, which is part of a polishing head. The wafer 11 is held in position by a mechanical retaining means, such as a retainer ring, and/or by the use of vacuum. Generally, the wafer 11 is rotated, while the belt/pad moves in a linear direction 16 to polish the wafer 11. A downforce is exerted to press the polishing head and carrier 18 downward, in order to engage the wafer onto the pad with some predetermined force. The linear polisher 10 also includes a slurry dispensing mechanism (not shown), which dispenses a slurry 21 onto the pad 15. A pad conditioner 20 is typically used in order to recondition the pad 15 during use. Techniques for reconditioning the pad 15 are known in the art and generally require a constant scratching of the pad in order to remove the residue build-up caused by the used slurry and removed waste material.

A support or platen 25 is disposed on the underside of belt 12 and opposite from polishing head 18, such that the belt/pad assembly resides between platen 25 and wafer 11. A primary purpose of platen 25 is to provide a supporting platform on the underside of the belt 12 to ensure that the pad 15 makes sufficient contact with wafer 11 for uniform polishing. Since the belt 12 is flexible and will depress when the wafer is pressed downward onto the pad 15, platen 25 provides a necessary counteracting support to this downward force.

The platen 25 can be a solid platform or it can be a fluid platen (also referred to as a fluid bearing). The preference is to have a fluid platen, so that the fluid flow from the platen 25 can be used to control forces exerted onto the underside of the belt 12. By such fluid flow control, pressure variations exerted by the pad on the wafer can be adjusted to provide a more uniform polishing across the face of the wafer 11. One example of a fluid platen is disclosed in U.S. Pat. No. 5,558,568. The concept of a linear polisher for use in providing linear planarization to polish semiconductor wafers is known. One implementation of the linear planarization technology is to perform CMP on a layer (such as a film layer) formed on a semiconductor wafer (such as a silicon wafer).

Figure 2:
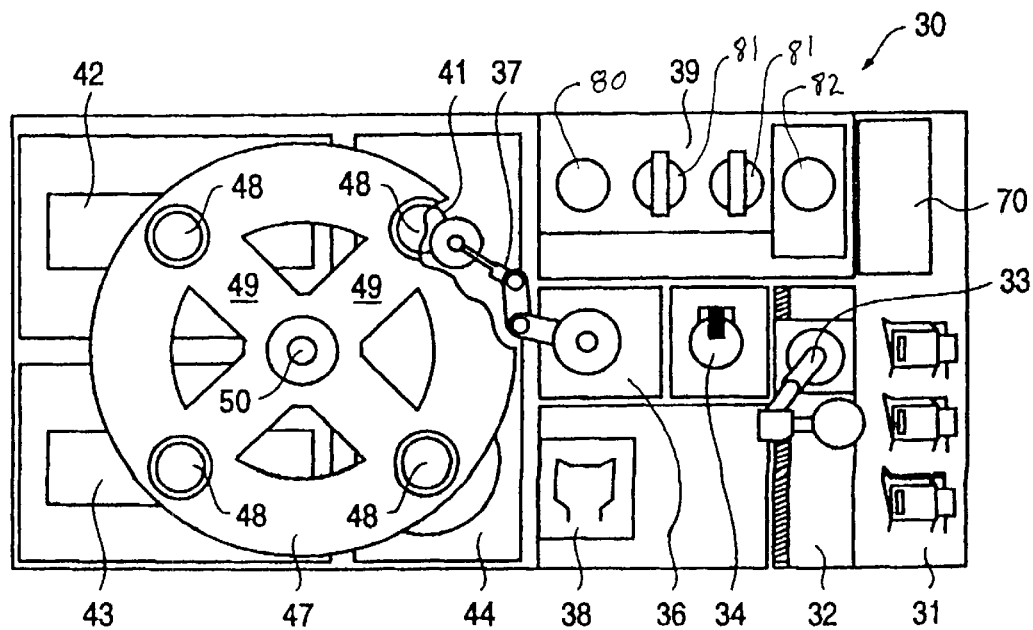
FIG. 2 is a top plan view of a cluster tool incorporating the linear polisher of FIG. 1 and implementing a load/unload/cleaner module of the present invention.

Referring to FIG. 2, it shows a cluster tool 30 which incorporates a plurality of linear polishers, such as the linear polisher 10 described above. The general concept of a cluster tool for semiconductor wafer processing is not in itself novel and a number of cluster tools are known in the art. Generally, a cluster tool incorporates a number of stations, each station for performing similar tasks. The cluster tool 30 implements this general concept of cluster tools, but a specific design of tool 30 is implemented for practicing the present invention.

The tool 30 is separated into a number of modules (or stations), some for performing a particular wafer process and others for transporting the wafer or controlling the operation of the tool. As shown at the right of the drawing in FIG. 2, an input/output (I/O) module 31 allows for the input and output of wafers from the tool 30. A cassette or cassettes holding multiple wafers are placed onto this module 31 for processing by the tool 30 and the processed wafers are returned to this module 31 for removal from the tool 30.

A dry robot module 32 is located adjacent to the I/O module 31 to load a wafer from the I/O module 31 to a pre-aligner module 34. A robot arm 33 is shown in the drawing for the actual pickup and movement of individual wafers. The robot arm 33 shown is but one design for providing such a function. The pre-aligner module 34 is utilized to align the wafer properly for pick up by a robot arm 37 associated with a wet robot module 36. As noted, two robot arms 33 and 37 are provided, one arm 33 to handle the wafer strictly when in the dry state and the other arm 37 to handle the wafer in other situations where the wafer is or may become wet.

Adjacent to one side of the wet robot module 36 is a wet queue module 38 and on the opposite side is a scrubber/cleaner module 39. The wet queue module 38 provides for temporary storage of wafers which have undergone the polishing cycle, but are still waiting for cleaning performed by the scrubber/cleaner module 39. The scrubber/cleaner module 39 provides the final scrubbing and cleaning of the wafer after CMP has been performed.

The main processing tasks are performed by four processing modules 41–44 which are also respectively referred to as stations 1–4. Station 1 (module 41) is a load, unload and clean module and its function is described in detail below. Station 2 (module 42) and station 3 (module 43) are each comprised of a polisher for performing CMP on a wafer. Although rotary polishing devices can be utilized for modules 42 and 43, the preferred technique is to utilize a linear polisher, such as the linear polisher 10 of FIG. 1. Accordingly, each of the linear polishing modules 42–43 can perform CMP to remove material from a substrate, such as a semiconductor wafer. It is also appreciated that only two such linear polishing modules are shown, but that the actual number to be included within tool 30 is a design choice.

Station 4 (module 44) is a rotary buff module, which includes a rotary pad to buff away waste and other particles that collect on the surface of the wafer during polishing. This module 44 is utilized to process the wafer when in the "wet" state. That is, the slurry and waste material present on the surface of the wafer are removed by the action of the module 44. As configured, station 4 can be utilized to buff clean a wafer surface after the polishing process has been completed, as well providing intermittent cleaning during the polishing cycle, when desired.

As noted, the four stations comprise the main processing units for performing the CMP process. The wet robot arm 37 transfers the wafer from the pre-aligner module 34 to the load/unload/clean (LUC) module 41. The LUC module 41 is detailed in FIG. 3 and further described later in the description below. Once the wafer is transferred to the LUC module 41, the wafer is cleaned and pre-process measurements are taken pursuant to the description noted in reference to FIG. 3.

Subsequently, the wafer is transferred to either one or both of the polishing modules 42–43, in which CMP is performed by the linear polisher 10 of FIG. 1. When the polishing is completed, the wafer is moved from either station 2 or 3 to station 4, where a rotating buffer pad removes the slurry and waste products. Although a variety of rotating devices can be used, the buffer of station 4 of the preferred embodiment is similar to a rotating polisher known in the art. A rotating table has a buffer pad upon which the face of the wafer engages. The buffer pad is of such a texture to buff the face of the wafer to remove the water and the spent slurry. Then, the wafer is moved to the LUC module 41, where the post-process measurements are taken. The wet robot arm 37 will pick up the wafer and remove it from station 1 to either the wet queue module 38 or the scrubber/cleaner module 39.

The transfer of the wafer from station to station can be achieved by a number of techniques, but the preferred embodiment utilizes a circular dial plate 47. The dial plate 47 has openings, which number coincides with the number of processing modules. In the particular example, four openings are disposed at 90 degree intervals. Into each of these openings is inserted a polishing head 48, which includes a carrier 46, for holding the wafer. Accordingly, in the drawing, four polishing heads 48 are disposed within the openings of the dial plate 47.

As shown in FIG. 2, the four polishing heads 48 are disposed 90 degrees apart in a circular pattern along the outer ring portion of the dial plate 47. The four modules 41–44 are configured so that the polishing heads are aligned at the appropriate operating position for each of the modules 41–44. Accordingly, one polishing head resides above a housing which receives the wafer in the LUC module 41, one each over the belt of the linear polisher of modules 42–43 and the fourth over the scrubber of module 44.

The radial center of the dial plate 47 is positioned centrally within the four modules 41–44, so that when the dial plate 47 is revolved about its center 50, the polishing heads 48 can be moved from one station to the next. The dial plate 47 is shown having two central cross beams 49 for support and is revolved about its center 50.

Referring to FIG. 3, a cross-section of the LUC module 41 is shown. In the Figure, a portion of the dial plate 47 is shown, in which the polishing head 48 resides in the opening overlying a support housing 51. Housing 51 may sometimes be referred to as a support or a platen. Only the relevant component parts of the polishing head assembly 48 are shown in FIG. 3 and are comprised of an outer support casing (or housing) 52, wafer carrier 46, wafer retaining ring 53 and a carrier film (wafer support pad) 54. The outer support casing 52 of the head assembly 48 fits into the opening of the dial plate 47 and also provides an outer support housing for the wafer carrier 46. The wafer carrier 46, which resides within the circumference of the support casing 52, is utilized for receiving and retaining a wafer 40 along its underside. The carrier film 54 is the wafer receiving surface and the retainer ring 53 ensures that horizontal movement of the wafer is restricted. The general structure of a wafer carrier is known in the art. It is also appreciated that the head 48 may include fluid lines (such as for water, air and/or other fluids) and/or vacuum lines for wafer retention. A number of carrier designs are known in the art, including the technique of floating the carrier.

As illustrated in FIG. 3, the robot arm 37 places the wafer 40 into position above the support housing 51. A drive mechanism 56 coupled to the underside of the housing 51 raises the housing upward to receive the wafer 40. The housing 51 supports the wafer until the wafer carrier 46 picks up the wafer 40. The robot arm 37 is moved out of the way after depositing the wafer onto the housing 51. In the example shown, the drive mechanism 56 is a pneumatically operated, vertical positioning cylinder. It has a flat rise plate 57 coupled to the underside of the housing 51 to raise and lower the housing 51. The housing is then raised until the wafer engages the carrier 46, at which time the wafer is retained onto the carrier film 54 (usually by the surface tension of the water present and/or the use of vacuum). Once the wafer 40 is positioned onto the carrier 46, the head 48 can be rotated to the other stations within the cluster ring of dial plate 47.

A uniqueness of the LUC unit of the present invention is the presence of a sensor 60 within the interior of the housing 51. It is understood that a plurality of sensors 60 can be present and in particular instances, a plurality of sensors may be preferred. In the preferred embodiment a single sensor is used and is adjusted to optically scan various surface areas of the wafer surface.

A variety of parameters can be monitored by the sensor 60, the preferred embodiment utilizes sensors for monitoring the thickness of the layer being polished. A variety of film thickness sensors known in the art can be adapted for use as the sensor 60. In the preferred embodiment, an optical sensor, having a model nomenclature of NOVASCAN 210 or 420 and manufactured by Nova Measuring Instruments Ltd. of Israel, is utilized. The scanning beam of the optical sensor is made to scan at desired locations along the wafer surface, typically under computer control, to obtain measurements at the desired locations. Since an optical sensor is employed, the upper surface of the housing 51 is made transparent. A transparent upper plate 58 is utilized. Glass or quartz are two such examples for the plate 58.

Also included around the periphery of the housing 51 is a plurality of fluid spraying nozzles 63. The nozzles can be situated on separate blocks 64 (as shown) or on a ring surrounding the top plate 58. The nozzles 63 spray fluid, such as de-ionized (D.I.) water to clean the wafer 40, as well as the carrier 46 and housing 51. The blocks 64 (or an equivalent device) also function to guide the wafer 40 being placed onto the top plate 58.

There are several advantages to having a thickness sensor integrated within the load and unload unit of a cluster tool. Instead of a complicated in-situ sensor, a more economical and simpler stand alone type of sensing can be achieved. Stand alone sensors offer a more proven technology over in-situ techniques. However, unlike the typical stand alone sensor units, the present invention does not require the wafer to be removed from the cluster tool configuration for measurements to be taken. Furthermore, since it is integrated into a unit which is required for the operation of the cluster tool, a separate monitoring module is not needed. With the use of the present invention, thickness measurements can be obtained at discrete time intervals during the polishing process.

In a typical operation, the housing 51 is positioned to a fully-extended position (highest vertical position) and D.I. water is sprayed onto clean the carrier film 54. Subsequently, the housing is lowered to an intermediate position for acceptance of the wafer 40 from the robot arm 37. Before the wafer is placed face down onto the top plate 58, D.I. water is sprayed to clean the wafer. The robot arm 37 places the wafer 40 onto the top plate 58 and retracts with the wafer 40 disposed thereon. Then, pre-processing measurement(s) is taken. Depending on the sensor being employed, the interior of the housing 51 may need to be filled with water to obtain the thickness measurement. If this is necessary, the housing 51 is filled with D.I. water for the measurement. After material thickness measurements are taken by the sensor 60, the housing 51 is raised to engage the wafer 50 to the carrier 46, in order to load the wafer onto the carrier film 54. Preferably, vacuum lines in the carrier impose a vacuum along the receiving surface of the carrier film 54, so that the wafer 40 will be picked up and held in place on the carrier 46.

Once the wafer is loaded onto the carrier 46, the dial plate 47 is rotated to the desired station. As to the configuration, a wafer can each be processed on one of the planarizing stations 2 or 3; or alternatively, part of the planarization can be performed at station 2 and subsequently at station 3. Although not shown, it is to be noted that each of the stations has its own spindle assembly, which lowers to engage the wafer carrier/polishing head assembly. That is, the wafer carrier 46 and its associated polishing head resides in the openings on the dial plate 47 and revolves with the dial plate to the various stations. The dial plate 47 has a retaining device 67, which prevents the head 48 from falling through the opening in the dial plate 47. The retaining device is mechanically operated (such as a spring) to engage the head 48. Pneumatic and hydraulic operated devices can be used as well. Once in position, a spindle assembly residing over the head 48 is lowered to engage the polishing head, also making the necessary connections for fluids and electrical lines to the head 48. The spindle is also engaged to rotate the polishing head, which causes the wafer 40 to rotate as well. When the spindle engages the head, the retaining device 67 is retracted, allowing the head 48 to be lowered in the opening of the dial plate 57 as the spindle is lowered.

Using this approach, a particular head assembly 48 retains the wafer as both are revolved with the dial plate 47 to the different stations. However, each spindle assembly stays stationary over its station. It is appreciated, that an alternative approach is to have the spindle assembly revolve along with the head assembly 48 and the dial plate 47. However, the preferred technique is the first approach, wherein there is a dedicated spindle assembly for each of the stations, which will engage the various carriers 46 as they are placed into position by the dial plate 47.

As noted, once the wafers are positioned in place at stations 2 and 3, the spindle is engaged to lower the polishing head which holds the carrier 46. Then, the wafer is polished by the linear polisher. At the conclusion of the polishing cycle, the spindle is disengaged and the wafer is revolved to station 4 for the buffing. Again, at this station 4, a spindle lowers to engage the head assembly, so that the wafer can be rotated after being lowered onto the buffing pad. Subsequently, after disengagement of the spindle at station 4, the wafer is returned to station 1. After spraying again with D.I. water to clean the wafer 40, a post-polishing thickness measurement(s) is/are taken. After the wafer has been transferred onto the top plate 58, a similar measurement technique as previously described is used to obtain the post-polishing measurements to determine the results of the planarization process. Then, the wafer is removed by the operation of the robot arm 37.

It is also appreciated that the wafer can be moved to station 1 at any time during the processing cycle to obtain one or more interim thickness measurement(s) of the layer being polished. Thus, multiple measurements can be obtained during the processing cycle, if desired, to determine the progress of the planarization cycle. The steps followed are equivalent to that for performing the post-process buff, clean and measurement steps.

Finally, as noted in FIG. 2, when the wafer is removed from the cluster modules by the operation of the wet robot arm 37, the wafer can be moved to the wet queue module 38 to await the final clean or it can be moved to the scrubber/clean module 39 for the final cleaning. This module 39 includes a load position unit 80 for accepting the wafer from the wet robot arm 37, two brushes 81 and a spin station 82 to perform the scrubbing and final spin cleaning. Subsequently, the dry robot arm 33 picks up the wafer from the spin station 82 and moves the wafer to the I/O module 31 for removal from the tool 30. Also noted in FIG. 3 is a control module 70, which contains the necessary control elements (such as a processor for operating the tool and obtaining the measurement) and user interface for operation of the tool 30.

Thus, an integration of a thickness monitoring unit in a load and unload unit of a cluster tool for performing CMP utilizing a linear polisher is described. It is appreciated that the cluster tool need not necessarily utilize a linear polisher. Other types of polishers can be employed without departing from the spirit and scope of the present invention. Furthermore, it is appreciated that the sensing unit can measure other parameters as well and need not be limited to the measurement of the thickness of the layer being polished.

Additionally, the sensing unit can be adapted into the configuration of other modules, instead of the LUC module 41 of the present invention. For example, the sensor can be housed within the load position unit 80 of the scrubber/cleaner module 39 or within the wet queue module 38. Since both units 80 and 38 are interim positions (or stations) for loading and/or unloading the wafer to the next location, a housing unit, similar to that of housing 51, can be installed for holding the wafer and a sensor disposed in the housing can then perform the thickness measurements. Accordingly, the scheme of the present invention can be implemented at locations other than at module 41, but the preference is to incorporate the sensing function within the module 41.

We claim:

1. An apparatus for polishing a material having a planar surface placed upon a polishing pad, the apparatus comprising:
  a movable housing for transferring the material, the movable housing disposed to receive the material for further transfer of the material to have the material polished and to receive the material once polishing is completed; and
  a sensor coupled to the movable housing to measure a polishing characteristic of the material at any discrete time during the transferring when the material rests upon said housing.

2. The apparatus of claim 1 wherein said sensor is a film thickness sensor for measuring film thickness of a film being polished.

3. The apparatus of claim 2 wherein said sensor is an optical sensor.

4. The apparatus of claim 2 further including a spray nozzle coupled to said housing for spraying fluid to clean the surface of the material.

5. The apparatus according to claim 1 further comprising:
  a robotic arm;
  a rotatable carrier spaced apart from the robotic arm, wherein the movable housing moves in at least one of two opposite directions during the transferring of the material between the robotic arm and the rotatable carrier for holding the material.

6. In a cluster tool for performing chemical-mechanical polishing (CMP) on a surface of a substrate or a layer formed on the substrate, an apparatus comprising:
  a movable housing for loading and unloading the substrate, the movable housing disposed to receive the substrate for further transfer of the substrate to have the surface polished and to receive the substrate once polishing is completed; and
  a sensor coupled to said housing to measure a polishing characteristic of the surface at any discrete time during the loading, during the unloading, when the substrate rests upon said housing.

7. The apparatus of claim 6 wherein said sensor is a film thickness sensor for measuring film thickness of a film being polished.

8. The apparatus of claim 7 wherein said sensor is an optical sensor.

9. The apparatus of claim 7 further including a spray nozzle coupled to said housing for spraying fluid to clean the surface.

10. The apparatus of claim 7 further including a drive mechanism coupled to said housing to raise and lower said housing for loading and unloading of the substrate.

11. In a cluster tool for performing chemical-mechanical polishing (CMP) on a layer formed on a semiconductor wafer, an apparatus comprising:
  a movable housing for loading and unloading the semiconductor wafer, the movable housing disposed to receive the wafer for further transfer of the wafer to have the layer polished and to receive the wafer once polishing is completed; and
  a sensor coupled to said housing to measure a polishing characteristic of the layer at any discrete time during the loading, during the unloading, when the wafer is placed upon said housing.

12. The apparatus of claim 11 wherein said sensor is a film thickness sensor for measuring film thickness of the layer being polished.

13. The apparatus of claim 11 wherein said sensor is an optical sensor.

14. The apparatus of claim 11 further including a spray nozzle coupled to said housing for spraying fluid to clean the wafer.

15. The apparatus of claim 11 further including a drive mechanism coupled to said housing to raise and lower said housing for loading and unloading of the wafer.

16. In a cluster tool for performing chemical-mechanical polishing (CMP) on a layer formed on a substrate, a method of monitoring a thickness of the layer being polished in a load and unload unit which loads and unloads the substrate from the cluster tool, comprising the steps of:

placing the substrate onto a movable housing disposed within the load and unload unit of the cluster tool;

measuring a pre-processing thickness of the layer during the transfer of the substrate using a sensor disposed in the load and unload unit while the substrate is on the movable housing;

moving the housing to move the substrate for transfer to a linear polishing tool;

polishing to planarize the layer on the linear polishing tool;

moving the housing to receive the substrate at the load and unload unit;

measuring a post-processing thickness of the layer using the sensor; and unloading the substrate from the cluster tool.

17. The method of claim 16 further including a step of cleaning the substrate before each measuring step.

18. The method of claim 16 wherein said steps of measuring the thickness is performed by optically scanning the layer using an optical sensor.

* * * * *